US012447560B2

(12) United States Patent
Iga

(10) Patent No.: US 12,447,560 B2
(45) Date of Patent: *Oct. 21, 2025

(54) MANUFACTURING METHOD OF SINGLE CRYSTAL SILICON SUBSTRATE

(71) Applicant: DISCO CORPORATION, Tokyo (JP)

(72) Inventor: Hayato Iga, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 315 days.

This patent is subject to a terminal disclaimer.

(21) Appl. No.: 18/321,977

(22) Filed: May 23, 2023

(65) Prior Publication Data

US 2023/0381894 A1    Nov. 30, 2023

(30) Foreign Application Priority Data

May 27, 2022 (JP) ................. 2022-086584

(51) Int. Cl.
*C30B 29/06* (2006.01)
*B23K 26/53* (2014.01)
*H01L 21/02* (2006.01)
*H01L 21/304* (2006.01)
*B23K 103/00* (2006.01)

(52) U.S. Cl.
CPC .............. *B23K 26/53* (2015.10); *C30B 29/06* (2013.01); *H01L 21/02381* (2013.01); *H01L 21/304* (2013.01); *B23K 2103/56* (2018.08)

(58) Field of Classification Search
CPC .... B23K 26/53; B23K 2103/56; C30B 29/06; H01L 21/304; H01L 21/02381
See application file for complete search history.

(56) References Cited

U.S. PATENT DOCUMENTS 12,202,173 B2 * 1/2025 Iga ...................... B28D 5/0011
2016/0288251 A1 * 10/2016 Hirata ................ B23K 26/0853

FOREIGN PATENT DOCUMENTS

JP         09262826 A    10/1997
JP       2022025566 A     2/2022

* cited by examiner

*Primary Examiner* — Robert M Kunemund
(74) *Attorney, Agent, or Firm* — Greer Burns & Crain Ltd.

(57) ABSTRACT

A manufacturing method of a single crystal silicon substrate includes a peeling layer forming step of forming, inside a workpiece, peeling layers that include modified portions and cracks propagating from the modified portions, and a separation step of separating the substrate from the workpiece using the peeling layers as starting points. The peeling layer forming step has a first processing step of forming some of the modified portions in first regions that each extend along a first direction and are separated from one another in a second direction orthogonal to the first direction, and a second processing step of forming the remaining part of the modified portions and the cracks in second regions that each extend along the first direction and that are separated from one another in the second direction.

4 Claims, 16 Drawing Sheets

FIG.10
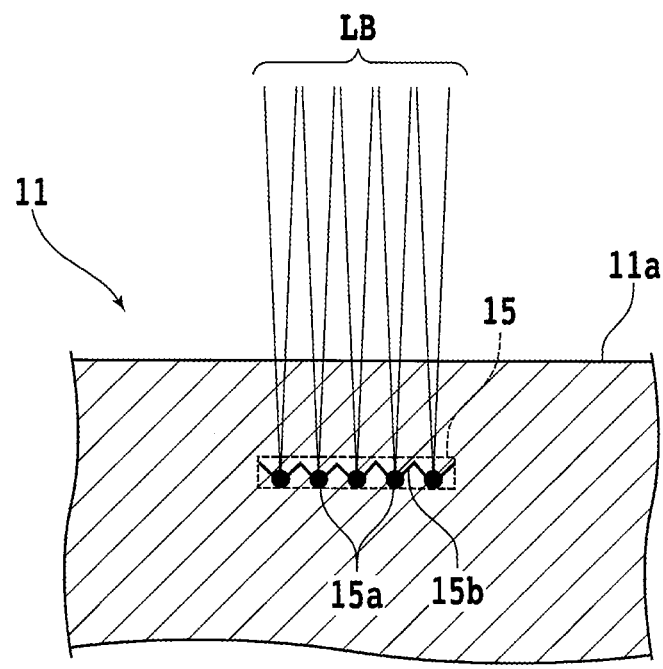
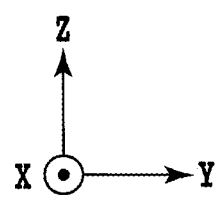

FIG.11
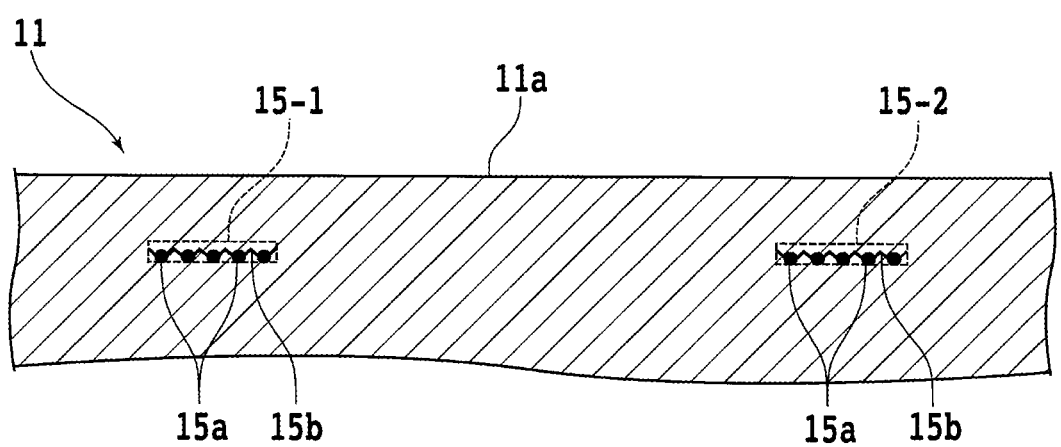
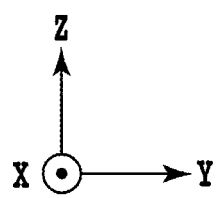

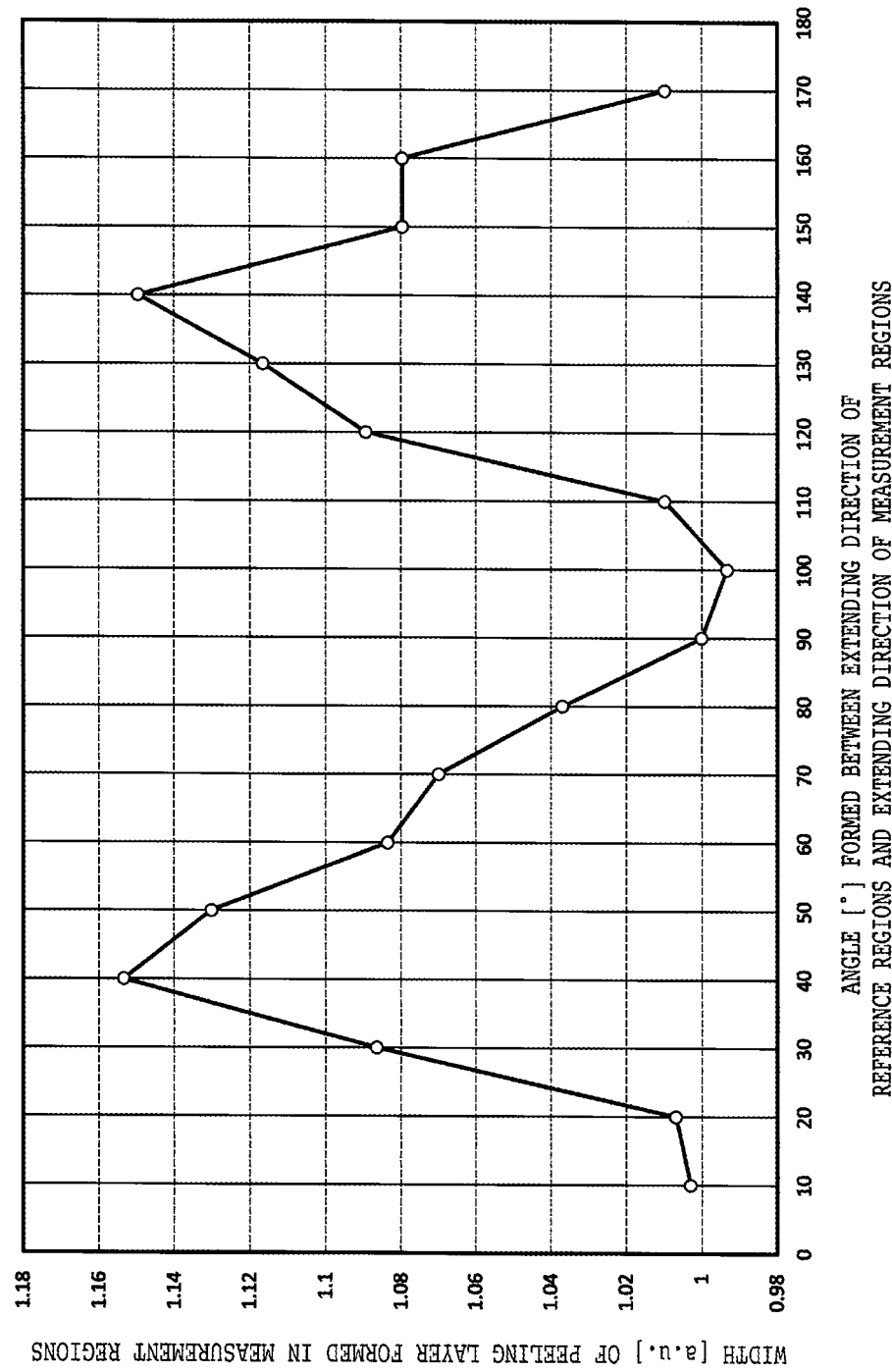

MANUFACTURING METHOD OF SINGLE CRYSTAL SILICON SUBSTRATE

BACKGROUND OF THE INVENTION

Field of the Invention

The present invention relates to a manufacturing method of a single crystal silicon substrate that manufactures the substrate from a workpiece formed of single crystal silicon and produced so that a specific crystal plane included in {100} crystal planes is exposed on a front surface and a back surface, respectively.

Description of the Related Art

Chips of semiconductor devices are generally manufactured by using disk-shaped single crystal silicon substrates (which may hereinafter be referred to simply as "substrates"). These substrates are each sliced from an ingot formed of cylindrical single crystal silicon using, for example, a wire saw (see, for example, JP H09-262826A).

When slicing a substrate from an ingot using a wire saw, a slicing margin is approximately 300 μm, and therefore is relatively large. Further, the substrate sliced as described above includes fine irregularities formed on surfaces thereof. Furthermore, the substrate is curved as a whole (a warp is produced in the substrate). The substrate hence needs surface planarization by applying lapping, etching and/or polishing to its surfaces.

Here, a material amount of the single crystal silicon to be used finally as substrates is approximately ⅔ of the material amount of the whole ingot. In other words, approximately ⅓ of the material amount of the whole ingot is disposed of when the substrates are sliced from the ingot and are planarized. Accordingly, the productivity is low when substrates are manufactured by using a wire saw as described above.

With the foregoing in view, a method has been proposed that forms peeling layers, which include modified portions and cracks propagating from the modified portions, inside a single crystal silicon ingot using a laser beam of a wavelength having transmissivity for single crystal silicon, and then separates a substrate from the ingot using the peeling layers as starting points (see, for example, JP 2022-25566A). This method can improve the productivity of substrates compared with the case in which substrates are manufactured from an ingot using a wire saw.

SUMMARY OF THE INVENTION

Single crystal silicon is most prone to cleavage at specific crystal planes included in {111} crystal planes. When modified portions are formed inside an ingot on a front surface and a back surface of which, for example, (100) crystal plane, that is, a specific crystal plane included in {100} crystal planes, is exposed, respectively, by applying a plurality of split laser beams along a [011] crystal orientation, that is, a specific crystal orientation included in <110> crystal orientations, substantial cracks occur propagating along crystal planes (specifically, the crystal planes represented by the following Miller indices (1)) parallel to the [011] crystal orientation out of the specific crystal planes included in the {111} crystal planes.

[Math. 1]

$$(1\bar{1}1), (11\bar{1}) \tag{1}$$

Here, an angle which the (100) crystal plane forms with respect to the specific crystal planes included in the {111} crystal planes is approximately 54.7°. If the split laser beams are applied to the ingot as mentioned above, the substantial cracks therefore occur with a greater component along a thickness direction than along a direction parallel to the front surface and back surface of the ingot.

In this case, thick peeling layers are formed inside the ingot, leading to an increase in the amount of the ingot substrate material to be disposed of when the substrates are sliced from the ingot and are planarized. With the foregoing in view, the present invention has as an object thereof the provision of a manufacturing method of a single crystal silicon substrate, which can improve the productivity of substrates when manufacturing the substrates from a workpiece such as an ingot using a laser beam.

In accordance with an aspect of the present invention, there is provided a manufacturing method of a single crystal silicon substrate that manufactures the substrate from a workpiece formed of single crystal silicon and produced so that a specific crystal plane included in {100} crystal planes is exposed on a front surface and a back surface, respectively. The manufacturing method includes a peeling layer forming step of forming, inside the workpiece, peeling layers that include modified portions and cracks propagating from the modified portions, and a separation step of, after performing the peeling layer forming step, separating the substrate from the workpiece using the peeling layers as starting points. The peeling layer forming step has a first processing step of forming some of the modified portions in a plurality of first regions that each extend along a first direction, the first direction being parallel to the specific crystal plane and forming an angle of 5° or less with respect to a specific crystal orientation included in <100> crystal orientations, and that are separated from one another in a second direction, the second direction being parallel to the specific crystal plane and being orthogonal to the first direction, and a second processing step of, after performing the first processing step, forming the remaining part of the modified portions and the cracks in a plurality of second regions that each extend along the first direction and that are separated from one another in the second direction. Any one of the second regions is located between adjacent paired first regions. Any one of the first regions is located between adjacent paired second regions. The first processing step is performed by alternately repeating a first laser beam irradiation step of relatively moving focal points, at which a plurality of split laser beams of a wavelength having transmissivity for the single crystal silicon are focused, and the workpiece along the first direction with the focal points positioned inside one of the first regions and at a first depth from the front surface of the workpiece, and a first indexing feed step of relatively moving positions, where the focal points are formed, and the workpiece along the second direction. The second processing step is performed by alternately repeating a second laser beam irradiation step of relatively moving the focal points and the workpiece along the first direction with the focal points positioned inside one of the second regions and at a second depth, the second depth being different from the first depth, from the front surface of the workpiece, and a second indexing feed step of relatively moving the positions, where the focal points are formed, and the workpiece along the second direction. The split laser beams to be focused at the focal points in the second laser beam irradiation step have a higher power than the split laser beams to be focused at the focal points in the first laser beam irradiation step.

Preferably, the second depth may be greater than the first depth.

Also preferably, a first plane that passes through a first straight line along the first direction, the first straight line passing through a center of the second region positioned between the adjacent paired first regions, and a second straight line along the first direction, the second straight line passing through a center of one of the adjacent paired first regions, may form an angle of 45° or less with respect to the front surface and the back surface of the workpiece, and a second plane that passes through the first straight line and a third straight line along the first direction, the third straight line passing through a center of the other one of the adjacent paired first regions, may form an angle of 45° or less with respect to the front surface and the back surface of the workpiece.

In the present invention, after the first processing step is performed to form the some of the modified portions in the first regions, the second processing step is performed to form the remaining part of the modified portions and cracks in the second regions.

When the modified portions are formed in the first processing step, the volume of the workpiece expands so that an internal stress is generated the workpiece. Further, the cracks formed in the second processing step are prone to propagate toward locations at each of which an internal stress has been generated.

The cracks to be formed in the second processing step are therefore prone to propagate toward the modified portions formed in the first processing step. In the present invention, it is accordingly possible to set the direction, in which the cracks are prone to propagate in the second processing step, as desired.

This facilitates to make thinner the peeling layers to be formed inside the workpiece. The formation of such thinner peeling layers decreases the material amount of the workpiece to be disposed of when substrates are sliced from the workpiece and are planarized. As a consequence, the present invention can improve the productivity of substrates when manufacturing them from a workpiece using a laser beam.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 10 is a fragmentary cross-sectional view schematically depicting a peeling layer including modified portions and cracks propagating from the modified portions, both, formed inside the ingot in the first laser beam irradiation step depicted in FIG. 8;

FIG. 11 is a fragmentary cross-sectional view schematically depicting peeling layers formed inside the ingot by performing twice the first laser beam irradiation step depicted in FIG. 8;

FIG. 15 is a graph depicting the widths of peeling layers formed respectively inside workpieces formed of single crystal silicon when split laser beams have been applied to regions along different crystal orientations;

DETAILED DESCRIPTION OF THE PREFERRED EMBODIMENT

Figure 1:
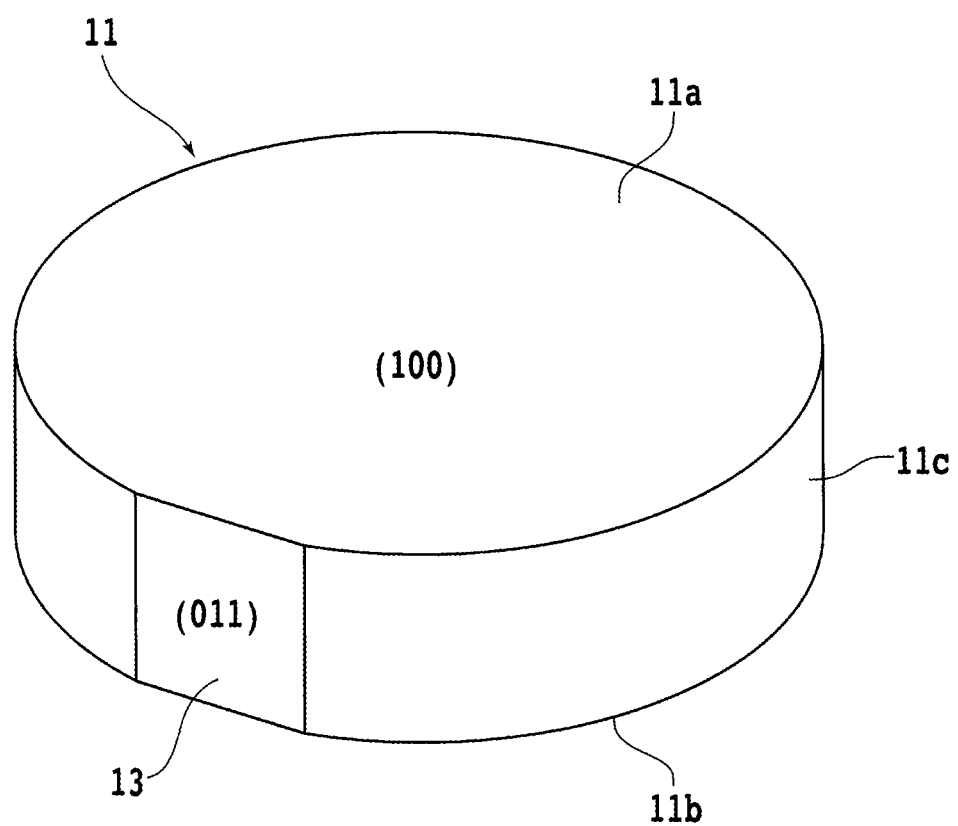
FIG. 1 is a perspective view schematically depicting an example of an ingot to be used in manufacture of a substrate.

With reference to the attached drawings, a description will be made about an embodiment of the present invention and its modifications. FIG. 1 is a perspective view schematically depicting an example of an ingot 11 to be used in manufacture of a substrate, and FIG. 2 is a top view schematically depicting the ingot 11 depicted in FIG. 1.

In FIG. 1, some crystal planes of single crystal silicon, which are exposed on planes included in the ingot 11, are also indicated. In FIG. 2, some crystal orientations of the single crystal silicon, which makes up the ingot 11, are also indicated.

Figure 2:
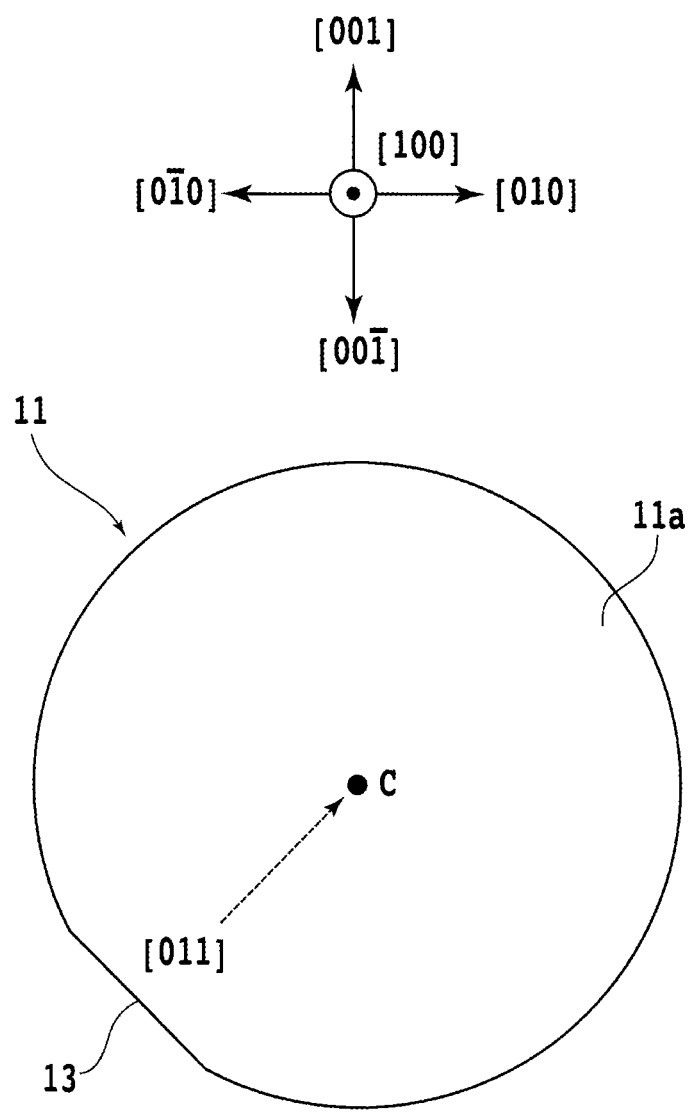
FIG. 2 is a top view schematically depicting the ingot depicted in FIG. 1.

In the ingot 11 depicted in FIGS. 1 and 2, a specific crystal plane (which is here assumed to be (100) crystal plane for the sake of convenience) included in {100} crystal planes is exposed on a front surface 11a and a back surface 11b, respectively. In other words, a vertical line (crystal axis) to the front surface 11a and the back surface 11b extends along a [100] crystal orientation in the ingot 11.

The ingot 11 is produced so that the (100) crystal plane is exposed on the front surface 11a and the back surface 11b, respectively, but a plane slightly inclined from the (100) crystal plane may be exposed on the front surface 11a and the back surface 11*b*, respectively, due to a processing error or the like at the time of the production.

Described specifically, the plane that forms an angle of 1° or less with respect to the (100) crystal plane may be exposed on the front surface 11*a* and the back surface 11*b*, respectively, of the ingot 11. In other words, the ingot 11 may have a crystal axis extending along a direction that forms an angle of 1° or less with respect to the [100] crystal orientation.

Further, an orientation flat 13 is formed in a side surface 11*c* of the ingot 11, and the ingot 11 has a center C located in a specific crystal orientation (which is here assumed to be a [011] crystal orientation for the sake of convenience) included in <110> crystal orientations as seen from the orientation flat 13. At the orientation flat 13, a (011) crystal plane of single crystal silicon is exposed accordingly.

Figure 3:
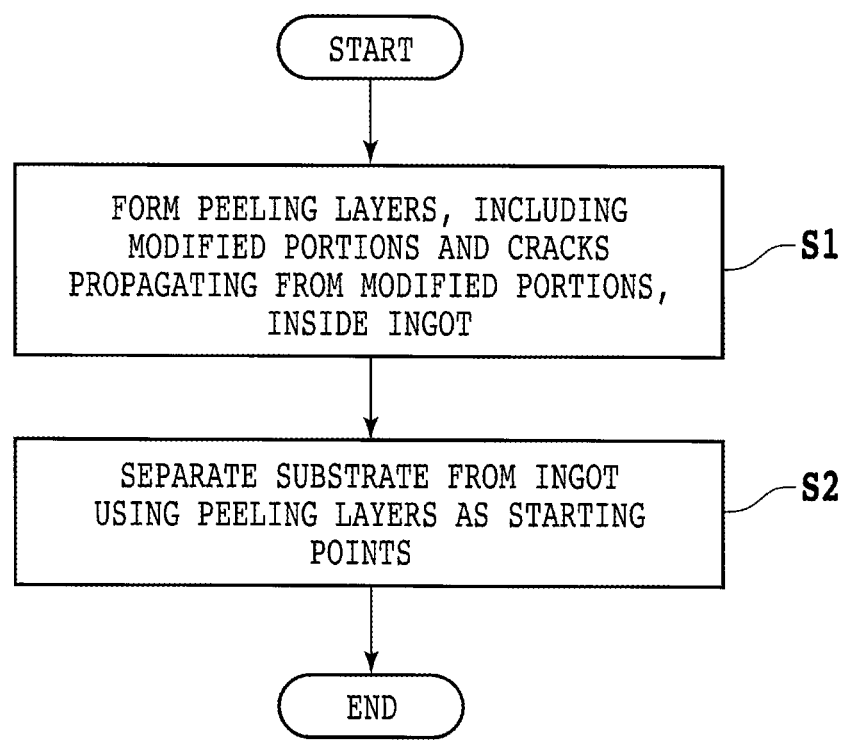
FIG. 3 is a flow chart schematically depicting a manufacturing method of a single crystal silicon substrate, according to an embodiment of the present invention, which manufactures the substrate from the ingot as a workpiece.

FIG. 3 is a flow chart schematically depicting a manufacturing method of a single crystal silicon substrate, according to an embodiment of the present invention, which manufactures the substrate from the ingot 11 as a workpiece. In this method, peeling layers that each include modified portions and cracks propagating from the modified portions are first formed inside the ingot 11 (peeling layer forming step: S1).

Figure 4:
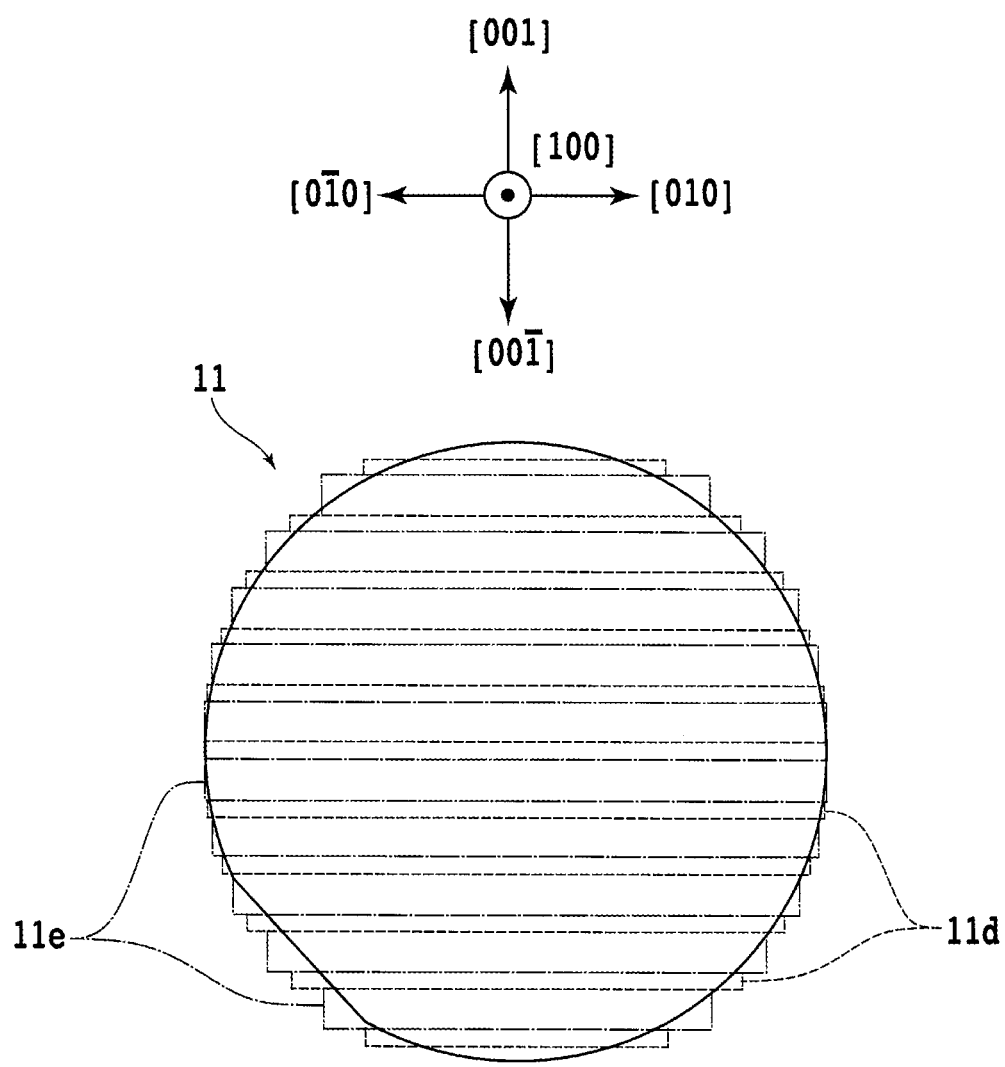
FIG. 4 is a top view schematically depicting a plurality of first regions and a plurality of second regions included in the ingot.
Figure 5:
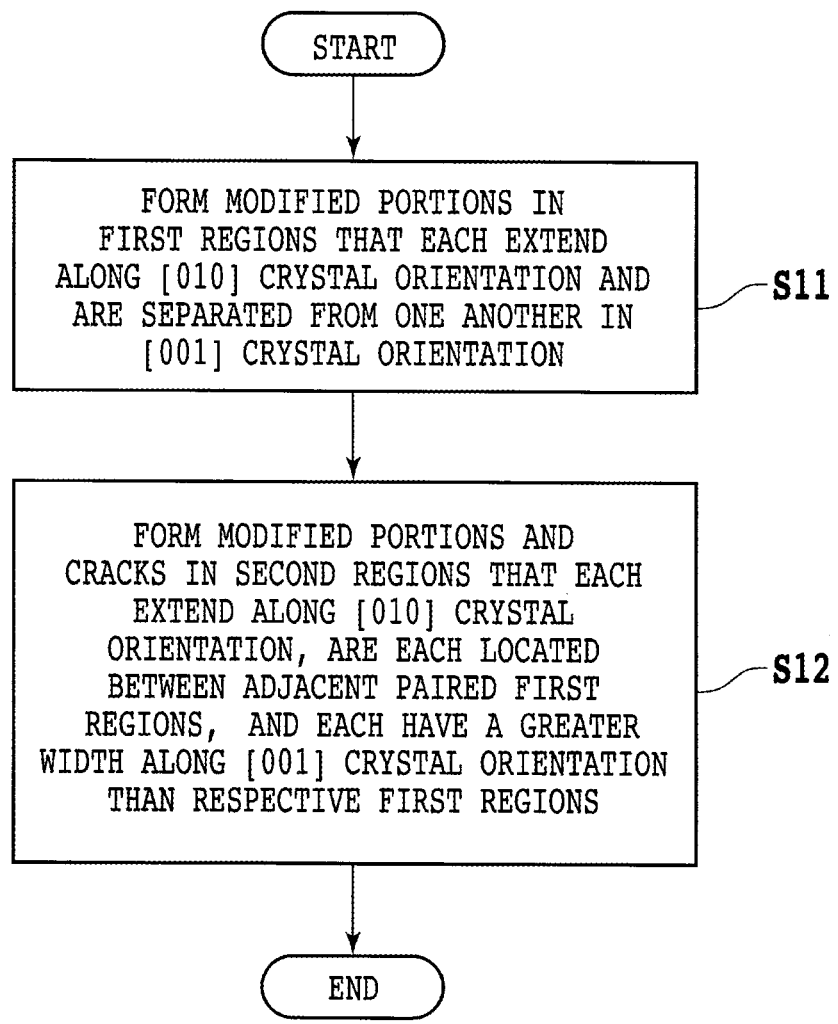
FIG. 5 is a flow chart schematically depicting an example of a peeling layer forming step depicted in FIG. 3.

In this peeling layer forming step (S1), a plurality of regions included in the ingot 11 is successively formed with peeling layers. FIG. 4 is a top view schematically depicting a plurality of first regions 11*d* and a plurality of second regions 11*e* included in the ingot 11. FIG. 5 is a flow chart schematically depicting an example of the peeling layer forming step (S1) depicted in FIG. 3.

The first regions 11*d* each extend along a [010] crystal orientation and are separated from one another in a [001] crystal orientation, while the second regions 11*e* each extend along the [010] crystal orientation, are each located between adjacent paired first regions 11*d*, and each have a greater width along the [001] crystal orientation than the respective first regions 11*d*.

In the peeling layer forming step (S1), some of the modified portions is first formed in the first regions 11*d* (first processing step: S11). After completion of the first processing step (S11), a remaining part of the modified portions and the cracks are then formed in the second regions 11*e* (second processing step: S12).

Figure 6:
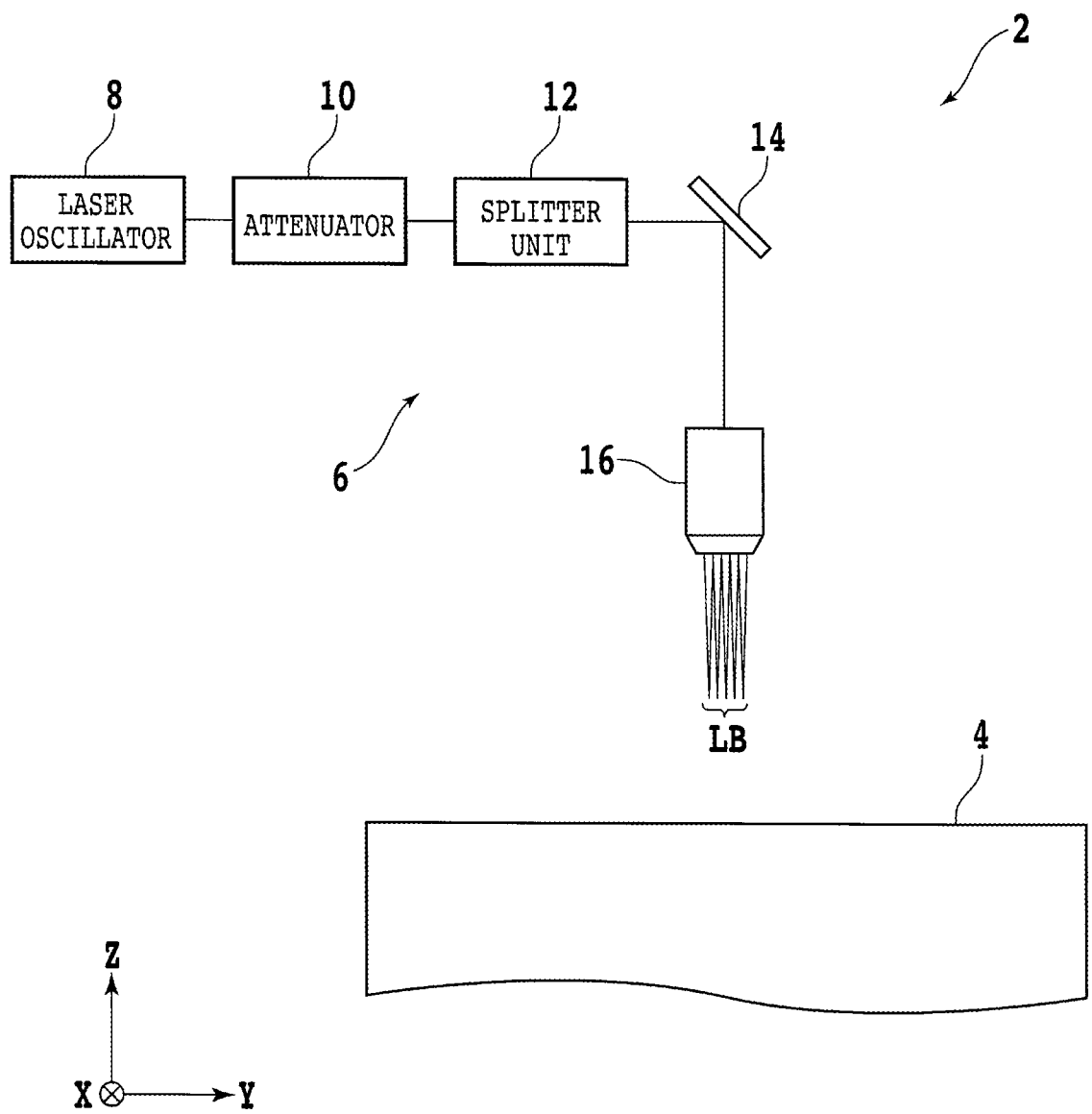
FIG. 6 is a diagram schematically depicting an example of a laser processing apparatus for use in forming peeling layers inside the ingot.

In the peeling layer forming step (S1), the peeling layers that include the modified portions and cracks are formed inside the ingot 11 by using a laser processing apparatus 2. FIG. 6 is a diagram schematically depicting an example of the laser processing apparatus 2 for use in forming the peeling layers inside the ingot 11.

An X-axis direction (first direction) and a Y-axis direction (second direction) indicated in FIG. 6 are directions that are orthogonal to each other on a horizontal plane, while a Z-axis direction also indicated in FIG. 6 is a direction (vertical direction) that is orthogonal to both the X-axis direction and the Y-axis direction. In FIG. 6, some of constituent elements of the laser processing apparatus 2 are depicted as function blocks.

The laser processing apparatus 2 depicted in FIG. 6 has a disk-shaped holding table 4. The holding table 4 has, for example, a circular upper surface (holding surface) parallel to the X-axis direction and the Y-axis direction. The holding table 4 also has a disk-shaped porous plate (not depicted) including an upper surface exposed on the holding surface.

The porous plate is in communication with a suction source (not depicted) such as a vacuum pump via a flow channel or the like disposed inside the holding table 4. When this suction source is operated, a suction force acts on a space near the holding surface of the holding table 4. The ingot 11 placed on the holding surface can therefore be held on the holding table 4.

Above the holding table 4, a laser beam irradiation unit 6 is disposed. The laser beam irradiation unit 6 has a laser oscillator 8. The laser oscillator 8 has, for example, Nd:YAG or the like as a laser medium.

The laser oscillator 8 applies a pulsed (frequency: 60 kHz, for example) laser beam LB of a wavelength (for example, 1,064 nm or 1,342 nm) that transmits through a material (single crystal silicon) making up the ingot 11.

The laser beam LB is adjusted in output power at an attenuator 10, and is then supplied to a splitter unit 12. The splitter unit 12 has a spatial optical modulator that includes a liquid crystal phase control device called a liquid crystal on silicon (LCoS), a diffractive optical element (DOE), and/or the like.

The splitter unit 12 splits the laser beam LB so that a plurality of split laser beams LB applied from a below-mentioned irradiation head 16 to a side of the holding surface of the holding table 4 forms a like plurality of (for example, 4 or more and 16 or less) focal points aligned side by side along the Y-axis direction.

The laser beams LB split at the splitter unit 12 are reflected by a mirror 14 and are guided to the irradiation head 16. In the irradiation head 16, condenser lens (not depicted) or the like are accommodated to condense the split laser beams LB. The split laser beams LB condensed through the condenser lens are then applied from a central region of a lower surface of the irradiation head 16, as an emitting region, to the side of the holding surface of the holding table 4, in short, straight down.

The irradiation head 16 of the laser beam irradiation unit 6 and an optical system (for example, the mirror 14), which guides the split laser beams LB to the irradiation head 16, are both connected to moving mechanisms (not depicted). These moving mechanisms each include, for example, a ball screw or the like. When one or more of these moving mechanisms are operated, the emitting region of the split laser beams LB is moved along the X-axis direction, Y-axis direction and/or Z-axis direction.

In the laser processing apparatus 2, the positions (coordinates) in the X-axis direction, Y-axis direction and Z-axis direction of the focal points, at which the split laser beams LB to be applied from the irradiation head 16 to the side of the holding surface of the holding table 4 are focused, can be adjusted by operating these moving mechanisms.

Figure 7:
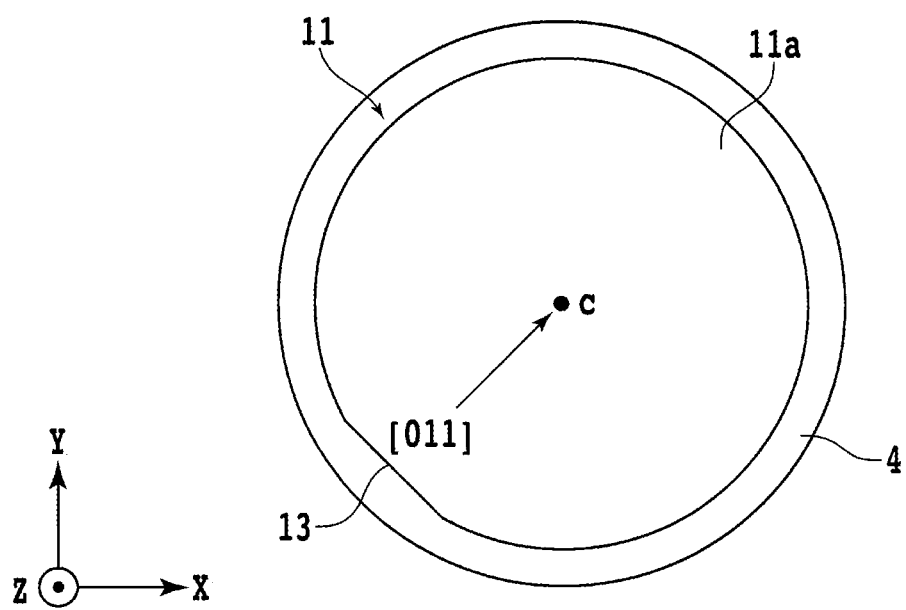
FIG. 7 is a top view schematically depicting how to hold the ingot on a holding table of the laser processing apparatus of FIG. 6.

When performing the peeling layer forming step (S1) on the laser processing apparatus 2, the ingot 11 is first held on the holding table 4 with the front surface 11*a* directed upward. FIG. 7 is a top view schematically depicting how to hold the ingot 11 on the holding table 4 of the laser processing apparatus 2.

The ingot 11 is held on the holding table 4, for example, in a state where a direction (the [011] crystal orientation) from the orientation flat 13 toward the center C of the ingot 11 forms an angle of 45° with respect to each of the X-axis direction and Y-axis direction.

The ingot 11 is therefore held on the holding table 4 in a state where, for example, the [010] crystal orientation is parallel to the X-axis direction, and the [001] crystal orientation is parallel to the Y-axis direction. After the ingot 11 has been held on the holding table 4 as described above, the first processing step (S11) is performed.

Figure 8:
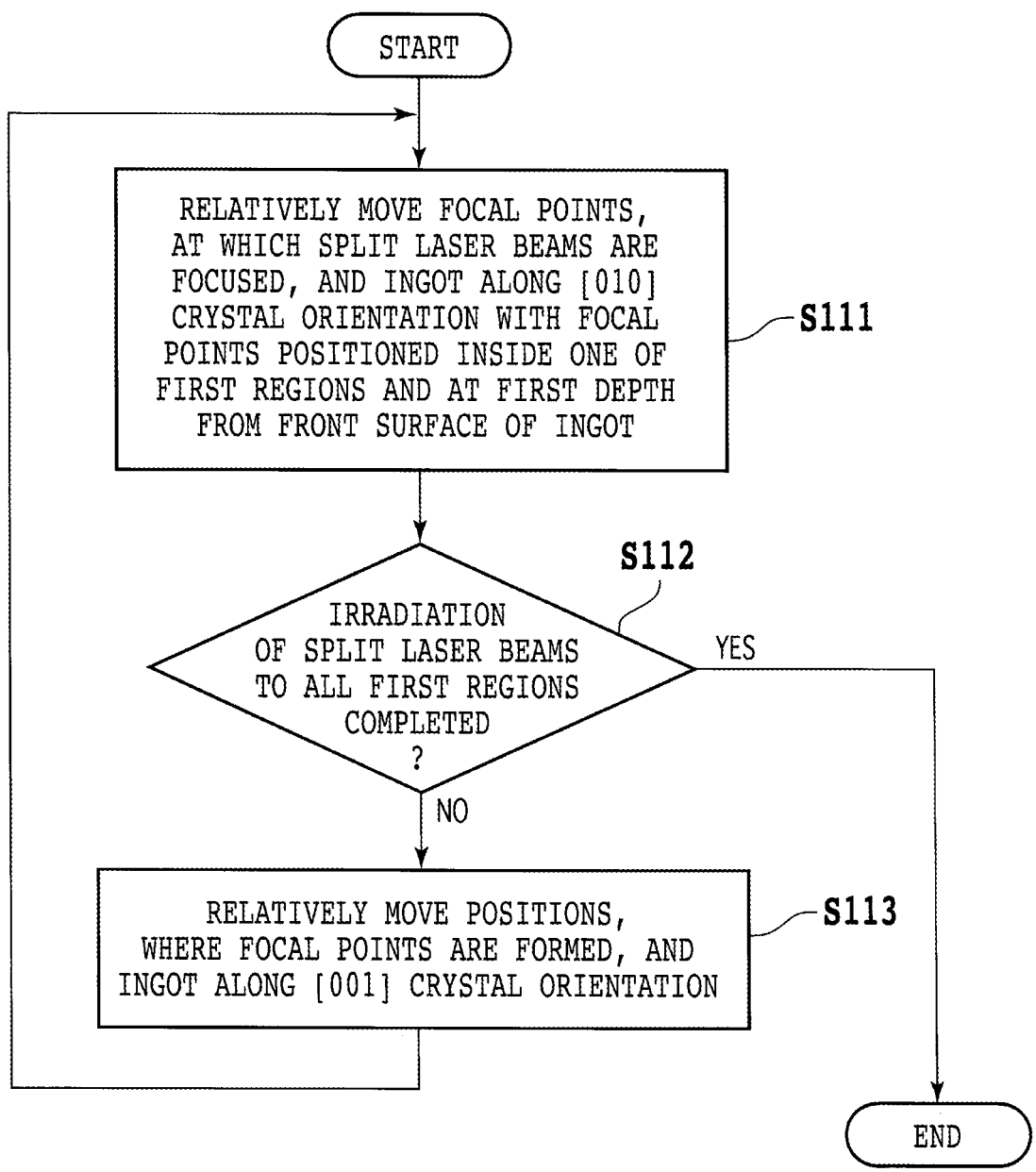
FIG. 8 is a flow chart schematically depicting an example of a first processing step depicted in FIG. 5.

FIG. 8 is a flow chart schematically depicting an example of the first processing step (S11) depicted in FIG. 5. In this first processing step (S11), the focal points, at which the split laser beams LB are focused, and the ingot 11 are first relatively moved along the X-axis direction (the [010] crystal orientation) with the focal points positioned inside one of the first regions 11d and at a first depth from the front surface 11a of the ingot 11 (first laser beam irradiation step: S111).

Figure 9A:
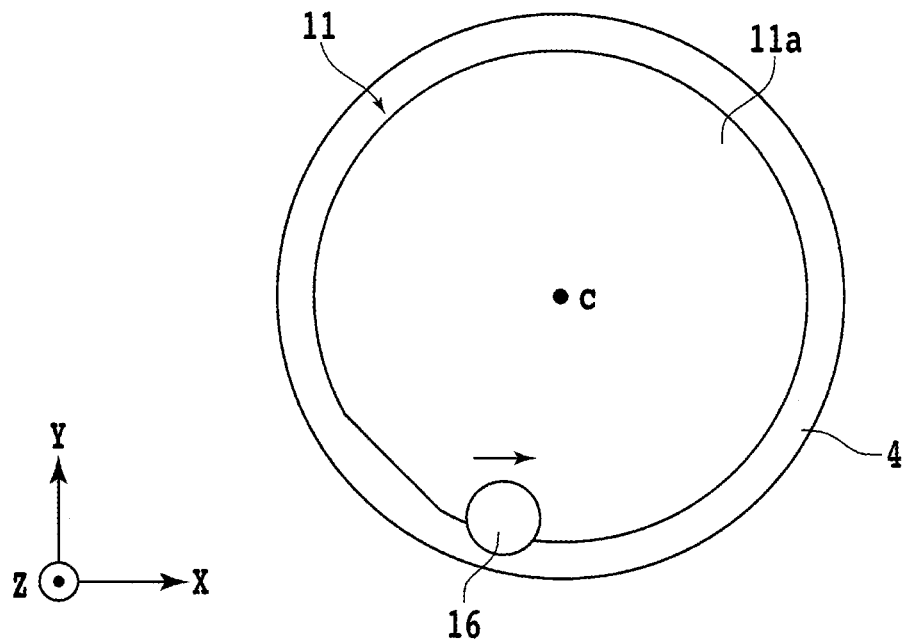
FIG. 9A is a top view schematically depicting how a first laser beam irradiation step depicted in FIG. 8 is performed.
Figure 9B:
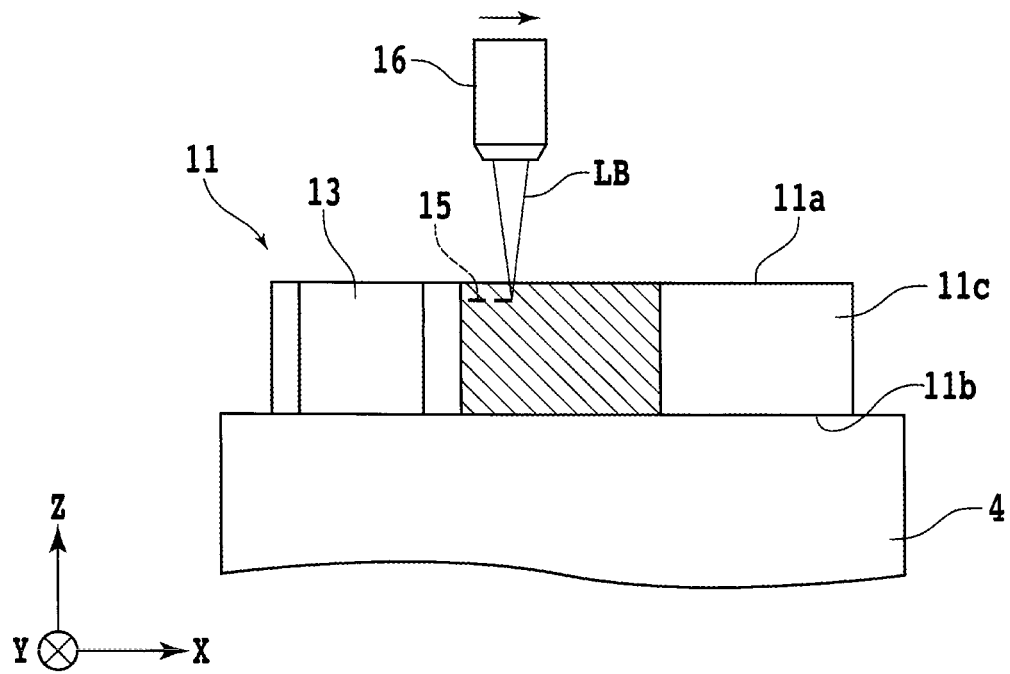
FIG. 9B is a fragmentary cross-sectional side view schematically depicting how the first laser beam irradiation step depicted in FIG. 8 is performed.

FIG. 9A is a top view schematically depicting how the first laser beam irradiation step (S111) depicted in FIG. 8 is performed, and FIG. 9B is a fragmentary cross-sectional side view schematically depicting how the first laser beam irradiation step (S111) depicted in FIG. 8 is performed. Further, FIG. 10 is a fragmentary cross-sectional view schematically depicting a peeling layer formed inside the ingot 11 in the first laser beam irradiation step (S111) depicted in FIG. 8 and including modified portions and cracks propagating from the modified portions.

In this first laser beam irradiation step (S111), a peeling layer is first formed, for example, in the first region 11d located at one end in the Y-axis direction (the [001] crystal orientation) out of the first regions 11d. Described specifically, the irradiation head 16 of the laser beam irradiation unit 6 is first positioned so that this first region 11d is positioned in the X-axis direction as seen from the irradiation head 16 in plan.

The irradiation head 16 is then moved up or down so that the focal points to be formed by focusing the individual split laser beams LB are positioned at a height corresponding to the first depth from the front surface 11a of the ingot 11.

The irradiation head 16 is then moved to allow it to pass from one end to the other end of the ingot 11 in the X-axis direction (the [010] crystal orientation) in plan while applying the split laser beams LB from the irradiation head 16 toward the holding table 4 (see FIGS. 9A and 9B).

When the irradiation head 16 is moved while applying the split laser beams LB as described above, the focal points and the ingot 11 are relatively moved along the X-axis direction (the [010] crystal orientation) with the focal points positioned at the first depth from the front surface 11a of the ingot 11.

The laser beam LB is split and focused so that focal points (for example, five focal points) are formed side by side at equal intervals in the Y-axis direction (the [001] crystal orientation) (see FIG. 10). The spacing between each two adjacent focal points is set to be, for example, 5 μm or more and 20 μm or less, typically 10 μm at this time.

The power of the split laser beams LB focused at the respective focal points, specifically the power obtained by dividing the power of the laser beam LB, which has been adjusted at the attenuator 10, with the number of splits (for example, 5) is relatively small, and is set, for example, to be 0.1 W or higher and 0.3 W or lower, typically at 0.2 W.

As a consequence, modified portions 15a disturbed in the crystal structure of single crystal silicon are formed centering around the respective focal points inside the ingot 11. Associated with the formation of the modified portions 15a inside the ingot 11, the volume of the ingot 11 expands, so that an internal stress is generated in the ingot 11.

Inside the ingot 11, cracks 15b then propagate from the modified portions 15a so that the internal stress is relaxed. As a result, a peeling layer 15 is formed inside the ingot 11, including the modified portions 15a and the cracks 15b propagating from the respective modified portions 15a.

It is to be noted that, in the first laser beam irradiation step (S111), the split laser beams LB may be applied with such a low power as allowing the cracks 15b not to propagate from the modified portions 15a although the modified portions 15a are formed inside the ingot 11. Accordingly, no cracks 15b may be included in the peeling layer 15 formed in the first laser beam irradiation step (S111).

Under a situation that the irradiation of the split laser beams LB has not been completed to all the first regions 11d (step (S112): NO), the positions, where the focal points are formed, and the ingot 11 are relatively moved along the Y-axis direction (the [001] crystal orientation) (first indexing feed step: S113).

In this first indexing feed step (S113), the irradiation head 16 is moved along the Y-axis direction (the [001] crystal orientation) until the irradiation head 16 is positioned in the X-axis direction (the [010] crystal orientation) as seen from the first region 11d which is, for example, adjacent the first region 11d, where the peeling layer 15 has already been formed, and in which no peeling layer 15 has been formed yet.

The above-mentioned first laser beam irradiation step (S111) is next performed again. When the first laser beam irradiation step (S111) is performed twice as described above, another peeling layer 15 (peeling layer 15-2) is formed inside the ingot 11, which as depicted in FIG. 11, is parallel to the peeling layer 15 (peeling layer 15-1) already formed and is separated from the peeling layer 15-1 in the Y-axis direction (the [001] crystal orientation).

Further, the first indexing feed step (S113) and the first laser beam irradiation step (S111) are alternately performed until the peeling layer 15 is formed in each of the first regions 11d included in the ingot 11. If the peeling layer 15 has been formed in each of the first regions 11d (step (S112): YES), the second processing step (S12) is then performed.

Figure 12:
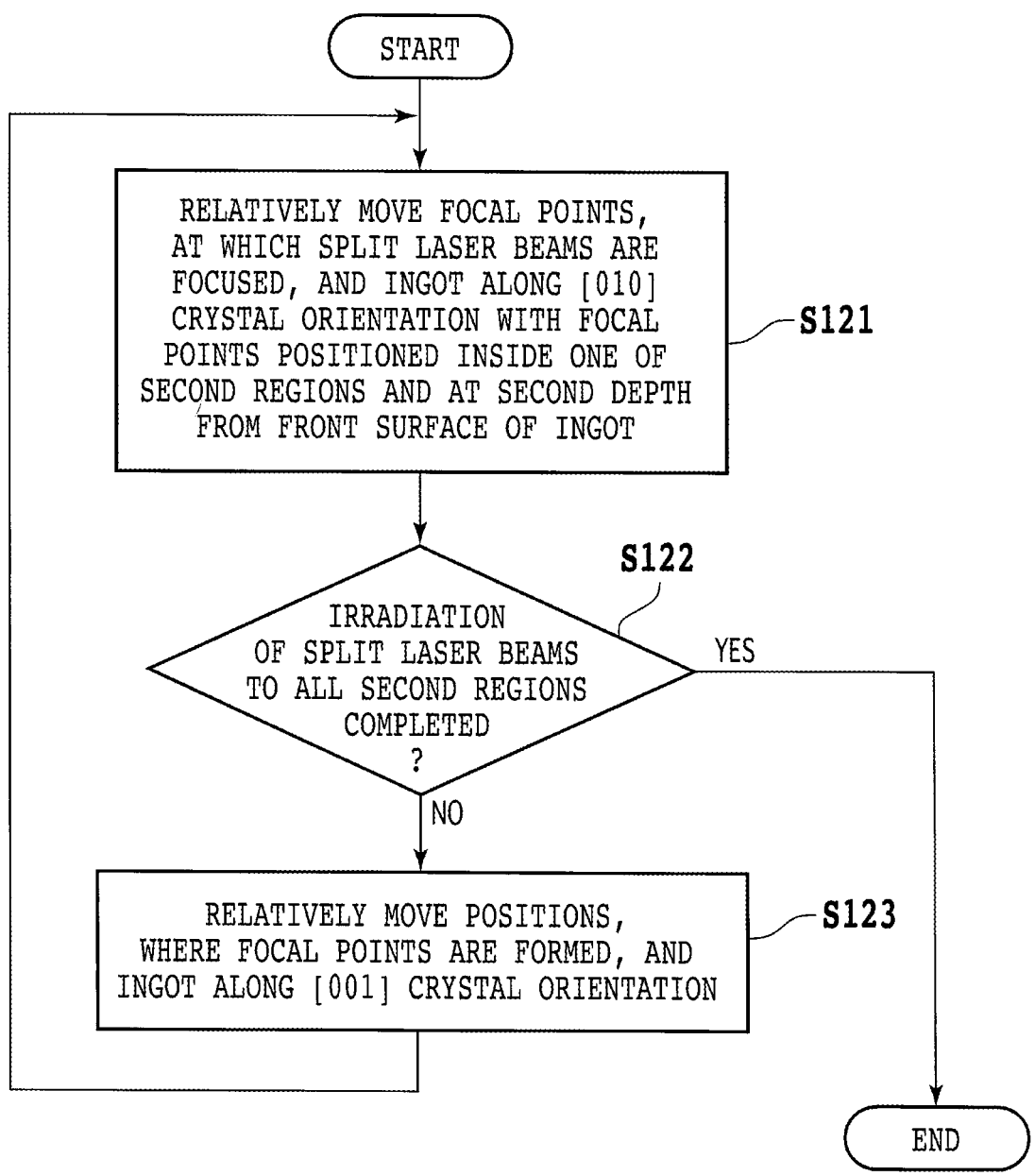
FIG. 12 is a flow chart schematically depicting an example of a second processing step depicted in FIG. 5.

FIG. 12 is a flow chart schematically depicting an example of the second processing step (S12) depicted in FIG. 5. In this second processing step (S12), the focal points, at which the split laser beams LB are focused, and the ingot 11 are first relatively moved along the X-axis direction (the [010] crystal orientation) with the focal points positioned inside one of the second regions 11e and at a second depth from the front surface 11a of the ingot 11 (second laser beam irradiation step: S121).

The second depth is different from the above-described first depth, and is, for example, greater than the first depth. For example, the difference between the first depth and the second depth is greater than 0 μm and 120 μm or less. In addition, this difference is set so that it becomes shorter than intervals at which the first regions 11d and the second regions 11e are arranged.

Described specifically, this difference is set so that it becomes shorter than an interval, in plan, between a straight line (first straight line) along the X-axis direction, the first straight line being located at a center in the Y-axis direction of the second region 11e, and another straight line (second straight line) along the X-axis direction, the second straight line being located at a center in the Y-axis direction of the first region 11d adjacent the second region 11e through which the first straight line passes.

In other words, the first depth and the second depth are set so that a plane (first plane), which passes both the straight lines, forms an angle of 45° or less with respect to the front surface 11a and back surface 11b of the ingot 11. Described more specifically, this angle is preferably 40° or less, more preferably 35° or less, most preferably 30° or less.

In the laser processing apparatus 2, the focal points at which the split laser beams LB are focused can also be set at the second depth from the front surface 11a of the ingot 11 by changing the position in the Z-axis direction of the irradiation head 16.

In the second laser beam irradiation step (S121), the irradiation head 16 is also moved along the X-axis direction (the [010] crystal orientation) and the Y-axis direction (the [001] crystal orientation) while applying the split laser beams LB from the irradiation head 16 toward the holding table 4, as in the above-mentioned first laser beam irradiation step (S111).

When the irradiation head 16 is moved while applying the split laser beams LB as described above, the focal points and the ingot 11 are relatively moved along the X-axis direction (the [010] crystal orientation) with the focal points positioned at the second depth from the front surface 11a of the ingot 11.

It is to be noted that the power of the split laser beams LB to be focused at their focal points in the second laser beam irradiation step (S121) is adjusted so that it becomes higher than the power of the split laser beams LB to be focused at their focal points in the first laser beam irradiation step (S111).

In the second laser beam irradiation step (S121), for example, the power of the split laser beams LB to be focused at their focal points is set to be, for example, higher than 0.3 W and 0.6 W or lower.

Figure 13:
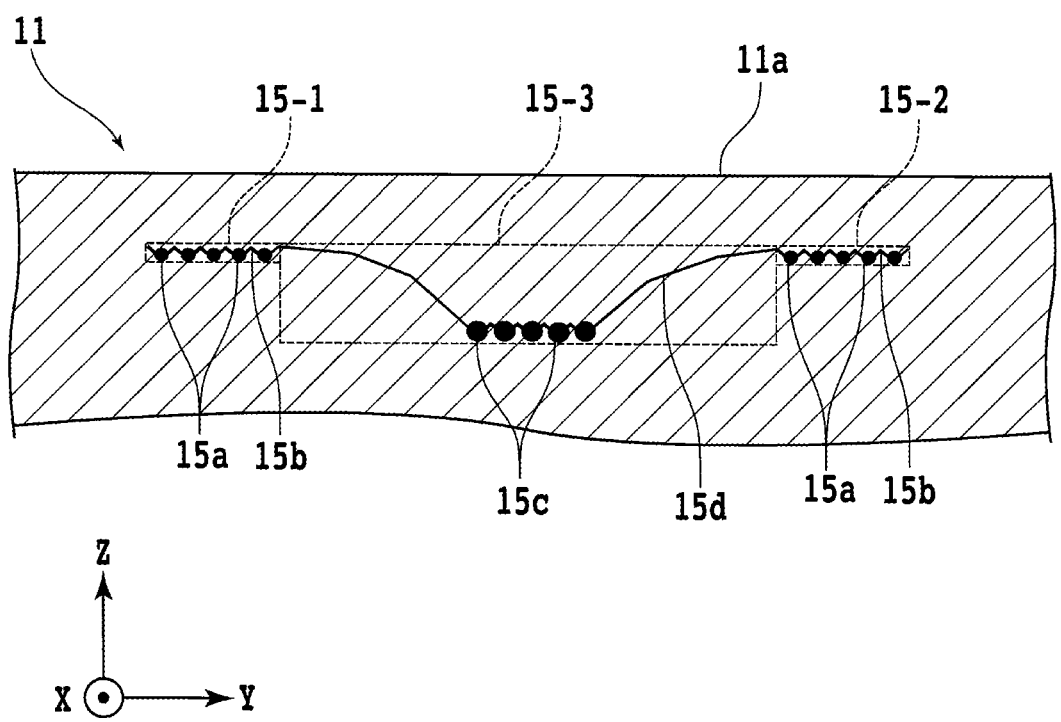
FIG. 13 is a fragmentary cross-sectional view schematically depicting a peeling layer formed inside the ingot by performing a second laser beam irradiation step depicted in FIG. 12.

As a consequence, modified portions 15c disturbed in the crystal structure of single crystal silicon are formed centering around the respective focal points inside the ingot 11 as depicted in FIG. 13. It is to be noted that the modified portions 15c have a greater size than the modified portions 15a because the power of the split laser beams LB to be focused at their focal points is also higher in the second laser beam irradiation step (S121) than in the first laser beam irradiation step (S111).

Further, a volume expansion of the ingot 11 associated with the formation of the modified portions 15c is also greater than that associated with the formation of the modified portions 15a, so that a greater internal stress is generated in the ingot 11 in the second laser beam irradiation step (S121) than in the first laser beam irradiation step (S111).

Inside the ingot 11, cracks 15d greater than the cracks 15b then propagate from the modified portions 15c so that the internal stress is relaxed. Further, the cracks 15d formed inside the ingot 11 are prone to propagate toward locations at each of which an internal stress has been generated.

The cracks 15d that propagate from the modified portions 15c are prone to propagate toward the modified portions 15a and/or cracks 15b included in the peeling layers 15 (peeling layers 15-1 and 15-2) already formed. As a result, a further peeling layer 15 (peeling layer 15-3) is formed inside the ingot 11, including the modified portions 15c and the cracks 15d propagating from the respective modified portions 15c.

Under a situation that the irradiation of the split laser beams LB has not been completed to all the second regions 11e (step (S122): NO), the positions, where the focal points are formed, and the ingot 11 are relatively moved along the Y-axis direction (the [001] crystal orientation) (second indexing feed step: S123).

In this second indexing feed step (S123), the irradiation head 16 is moved along the Y-axis direction (the [001] crystal orientation) until the irradiation head 16 is positioned in the X-axis direction (the [010] crystal orientation), for example, as seen from the second region 11e which is adjacent the second region 11e, where the peeling layer 15 has already been formed, and in which no peeling layer 15 has been formed yet.

The above-mentioned second laser beam irradiation step (S121) is next performed again. Further, the second indexing feed step (S123) and the second laser beam irradiation step (S121) are alternately repeated until the peeling layer 15 is formed in each of the second regions 11e included in the ingot 11.

If the peeling layer 15 has been formed in each of the second regions 11e (step (S122): YES), the peeling layer forming step (S1) depicted in FIG. 3 is completed with the peeling layers 15 formed throughout the inside of the ingot 11.

In this peeling layer forming step (S1), the thickness of the peeling layers 15 to be formed inside the ingot 11 can be controlled to be small owing to the setting of the first depth and the second depth as mentioned above. A description will hereinafter be made in this regard.

A method of formation of the peeling layers 15 throughout the inside of the ingot 11 is not limited to the above-mentioned method. For example, the peeling layers 15 can also be formed throughout the inside of the ingot 11 by performing only the above-mentioned second processing step (S12) without performing the above-mentioned first step (S11). In this case, however, the cracks 15d that propagate in the second processing step (S12) may have a greater component along a thickness direction of the ingot 11.

If the first processing step (S11) is performed before the second processing step (S12) and the first depth and the second depth are set as mentioned above, on the other hand, the cracks 15d are prone to have a greater component along a direction orthogonal to the thickness direction of the ingot 11 than along the thickness direction. As a result, the thickness of the peeling layers 15 formed inside the ingot 11 is relatively small if the first depth and the second depth are set as mentioned above.

Figure 14A:
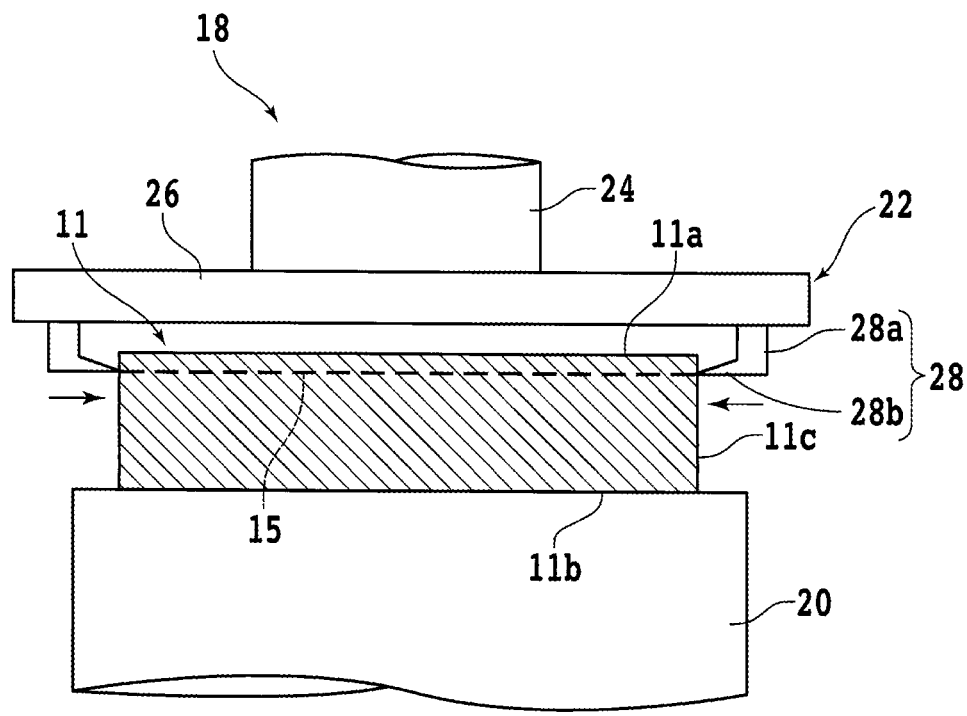
FIG. 14A is a partly cross-sectional side view schematically depicting how a first example of a separation step depicted in FIG. 3 is performed at a first stage.
Figure 14B:
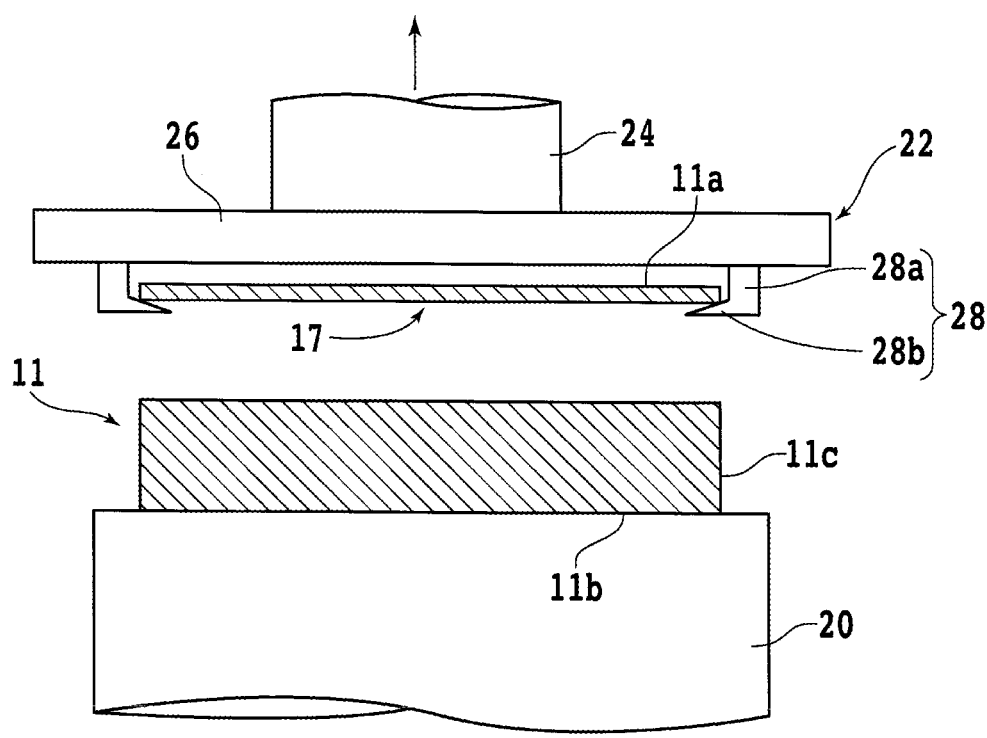
FIG. 14B is a partly cross-sectional side view schematically depicting how the first example of the separation step depicted in FIG. 3 is performed at a second stage.

If the peeling layer forming step (S1) depicted in FIG. 3 has been completed, the substrate is then separated from the ingot 11 using the peeling layers 15 as starting points (separation step: S2). FIGS. 14A and 14B are partly cross-sectional side views schematically depicting how the separation step (S2) depicted in FIG. 3 is performed, respectively. This separation step (S2) is performed, for example, on a separation apparatus 18 depicted in FIGS. 14A and 14B.

The separation apparatus 18 has a holding table 20 that holds the ingot 11 with the peeling layers 15 formed therein. The holding table 20 has a circular upper surface (holding surface), and a porous plate (not depicted) is exposed on the holding surface.

Further, this porous plate is in communication with a suction source (not depicted) such as a vacuum pump via a flow channel or the like disposed inside the holding table 20. When this suction source is operated, a suction force acts on a space near the holding surface of the holding table 20. As a consequence, the ingot 11 placed, for example, on the holding surface can be held by the holding table 20.

Above the holding table 20, a separation unit 22 is also disposed. The separation unit 22 has a cylindrical support member 24. To an upper portion of the support member 24, a lift mechanism (not depicted) of, for example, the ball screw type and a rotary drive source such as a motor are connected.

By operating this lift mechanism, the separation unit 22 is therefore moved up or down. By operating the rotary drive source, the support member 24 is rotated about a straight line that as an axis of rotation, extends through a center of the support member 24 and along a direction vertical to the holding surface of the holding table 20.

A lower end portion of the support member 24, on the other hand, is centrally fixed on an upper portion of a disk-shaped base 26. On a lower side of an outer peripheral region of the base 26, movable members 28 are disposed at substantially equal intervals along a peripheral direction of the base 26. These movable members 28 each have a strip-shaped pendant arm portion 28a that downwardly extends from a lower surface of the base 26.

Each pendant arm portion 28a is connected at an upper end portion thereof to an actuator such as an air cylinder incorporated in the base 26, and by operating the actuator, the corresponding movable member 28 is moved along a radial direction of the base 26. On an inner side wall of a lower end portion of each pendant arm portion 28a, a strip-shaped wedge portion 28b is disposed extending toward a center of the base 26. The wedge portion 28b is progressively reduced in thickness toward a distal end thereof.

On the separation apparatus 18, the separation step (S2) is performed, for example, in the following order. Described specifically, the ingot 11 is first placed on the holding table 20 so that a center of the back surface 11b of the ingot 11, in which the peeling layers 15 have been formed, and a center of the holding surface of the holding table 20 are brought into registration with each other.

The suction source, which is in communication with the porous plate exposed on the holding surface, is then operated so that the ingot 11 is held on the holding table 20. The actuators are then operated so that the movable members 28 are each positioned radially outside the base 26.

The lift mechanism is then operated so that the distal ends of the wedge portions 28b of the individual movable members 28 are positioned at a height corresponding to the peeling layers 15 formed inside the ingot 11. The actuators are next operated so that the wedge portions 28b are driven into the side surface 11c of the ingot 11 (see FIG. 14A).

The rotary drive source is then operated so that the wedge portions 28b driven into the side surface 11c of the ingot 11 are rotated. The lift mechanism is then operated to raise the wedge portions 28b (see FIG. 14B).

By driving the wedge portions 28b into the side surface 11c of the ingot 11, rotating the wedge portions 28b, and then raising the wedge portions 28b as described above, the cracks 15b and 15d contained in the peeling layers 15 are allowed to propagate further. As a result, the ingot 11 is separated between the side of the front surface 11a and the side of the back surface 11b. A substrate 17 is therefore manufactured from the ingot 11 using the peeling layers 15 as starting points.

If the ingot 11 is separated between the side of the front surface 11a and the side of the back surface 11b at the time that the wedge portions 28b have been driven into the side surface 11c of the ingot 11, the wedge portions 28b need no rotation. As a further alternative, the actuators and the rotary drive source may be operated concurrently to drive the rotating wedge portions 28b into the side surface 11c of the ingot 11.

In the above-mentioned manufacturing method of the single crystal silicon substrate, after the first processing step (S11) has been performed to form the modified portions 15a in the first regions 11d, the second processing step (S12) is performed to form the modified portions 15c and cracks 15d in the second regions 11e.

When the modified portions 15a are formed in the first processing step (S11), the volume of the ingot 11 expands so that an internal stress is generated inside the ingot 11. Further, the cracks 15d formed in the second processing step (S12) are prone to propagate toward locations at each of which the internal stress has been generated.

The cracks to be formed in the second processing step (S12) are therefore prone to propagate toward the modified portions 15a formed in the first processing step (S11). In this method, it is accordingly possible, as desired, to set the direction, in which the cracks 15d are prone to propagate, in the second processing step (S12).

This facilitates to make thinner the peeling layers 15 to be formed inside the ingot 11. The formation of such thinner peeling layers 15 decreases the amount of the ingot material to be disposed of when substrates 17 are sliced from the ingot 11 and are planarized. As a consequence, this method can improve the productivity of the substrates 17 when manufacturing them from the ingot 11 using the laser beam LB.

In this method, the split laser beams LB are applied along the [010] crystal orientation to the ingot 11 formed of single crystal silicon as produced so that the (100) crystal plane is exposed on the front surface 11a and the back surface 11b, respectively.

Here, the [010] crystal orientation forms a large angle (for example, 45°) with respect to a specific crystal orientation (for example, a [011] crystal orientation) included in <110> crystal orientations. Hence, in this method, cracks are hence hard to propagate from the modified portions 15a and 15c, which have been formed inside the ingot 11 by the irradiation of the split laser beams LB, along specific crystal planes (for example, the crystal planes represented by the following Miller indices (2)) included in {111} crystal planes.

[Math. 2]

$$(1\bar{1}1), (11\bar{1}) \qquad (2)$$

Furthermore, in this method, substantial cracks however occur propagating from the modified portions 15a and 15c, which have been formed inside the ingot 11 by the irradiation of the split laser beams LB, along crystal planes (specifically, the crystal planes represented by the following Miller indices (3)) parallel to the [010] crystal orientation out of the specific crystal planes included in {110} crystal planes.

[Math. 3]

$$(101), (\bar{1}01) \qquad (3)$$

A crystal plane (for example, a (101) crystal plane) parallel to the [010] crystal orientation out of specific crystal planes included in the {110} crystal planes forms an angle of 45° with respect to the (100) crystal plane, whereas the specific crystal plane included in the {111} crystal planes forms an angle of approximately 54.7° with respect to the (100) crystal plane.

In this method, it is therefore possible to suppress the occurrence of cracks that have a greater component along the thickness direction of the ingot 11 than along the direction parallel to its front surface 11a and back surface 11b.

In this case, thickening of the peeling layers 15 to be formed inside the ingot 11 is suppressed, thereby decreasing the material amount of the ingot 11 and substrates 17 to be disposed of when the substrates 17 are sliced from the ingot 11 and are planarized. As a result, this method can further improve the productivity of the substrates 17 when manufacturing them from the ingot 11 using the laser beam LB.

It is to be noted that the above-mentioned manufacturing method of the single crystal silicon substrate is an embodiment of the present invention, and therefore the present invention is not limited to the above-mentioned method. For example, the ingot useful for the manufacture of the substrate in the present invention is not limited to the ingot 11 depicted in FIGS. 1, 2, and so on.

Described specifically, in the present invention, a substrate may also be manufactured from an ingot with one or more notches formed in a side surface thereof. As a further alternative, in the present invention, a substrate may also be manufactured from an ingot with neither an orientation flat nor a notch formed in a side surface thereof.

It is also to be noted that the construction of the laser processing apparatus for use in the present invention is not limited to the construction of the above-mentioned laser processing apparatus 2. The present invention may be practiced by using, for example, a laser processing apparatus in which moving mechanisms are disposed to move the holding table 4 along the X-axis direction, Y-axis direction and/or Z-axis direction, respectively.

As a further alternative, the present invention may also be practiced by using a laser processing apparatus with a scanning optical system, which can change the directions of the split laser beams LB to be applied from the irradiation head 16, disposed in the laser beam irradiation unit 6. It is to be noted that this scanning optical system includes, for example, a galvanoscanner, an acoustic optical device (AOD), a polygon mirror, and/or the like.

In other words, insofar as the ingot 11 held on the holding table 4 and the focal points of the split laser beams LB applied from the irradiation head 16 can be relatively moved along the X-axis direction, the Y-axis direction, and the Z-axis direction, respectively, no limitations are imposed on the construction for their relative movement in the present invention.

Further, the first regions and the second regions included in the ingot 11, to which the split laser beams LB are applied, respectively, in the peeling layer forming step (S1) of the present invention are not limited to regions along the [010] crystal orientation. For example, the split laser beams LB may be applied to regions along the [001] crystal orientation in the present invention.

If the split laser beams LB are applied to the ingot 11 as described above, cracks are prone to propagate in the crystal planes represented by the following Miller indices (4).

[Math. 4]

$$(110), (\bar{1}10) \quad (4)$$

Moreover, in the present invention, the split laser beams LB may be applied to regions along a direction that is slightly inclined from the [010] crystal orientation or [001] crystal orientation in plan. In this regard, a description will be made with reference to FIG. 15.

FIG. 15 is a graph depicting the widths of peeling layers formed respectively inside workpieces formed of single crystal silicon when split laser beams LB have been applied to regions along different crystal orientations. The abscissa of this graph represents the angle formed in plan between a direction, in which a region (reference region) orthogonal to the [011] crystal orientation extends, and another direction, in which a region to be measured (measurement region) extends.

Described specifically, if a value on the abscissa of this graph is 45°, a region along the [001] crystal orientation is to be measured. Similarly, if a value on the abscissa of this graph is 135°, a region along the [010] crystal orientation is to be measured.

On the other hand, the ordinate of this graph represents the value when the width of a peeling layer formed in the measurement region by applying the split laser beams LB to the measurement region is divided by the width of a peeling layer formed in the reference region by applying the split laser beams LB to the reference region.

As depicted in FIG. 15, the width of the peeling layer becomes great when the angle formed between the direction, in which the reference region extends, and the direction, in which the measurement region extends, is 40° or more and 50° or less, or 130° or more and 140° or less. In other words, the width of the peeling layer becomes great when the split laser beams LB are applied to the regions along not only the [001] crystal orientation or [010] crystal orientation but also a direction that forms an angle of 5° or less with respect to these crystal orientations.

In the peeling layer forming step (S1) of the manufacturing method of this embodiment, the split laser beams LB may be applied to regions along a direction that is slightly inclined at an angle of 5° or less from the [001] crystal orientation or [010] crystal orientation in plan.

In the peeling layer forming step (S1) of the present invention, the split laser beams LB may hence be applied to regions that are parallel to a crystal plane (here, the (100) crystal plane) exposed on the front surface 11*a* and the back surface 11*b* of the ingot 11 out of the specific crystal planes included in the {100} crystal planes, and that extend along a direction (first direction) forming an angle of 5° or less with respect to a specific crystal orientation included in the <100> crystal orientations (here, the [001] crystal orientation or [010] crystal orientation).

In the present invention, it is not an indispensable characteristic feature to form the peeling layers 15 throughout the inside of the ingot 11 in the peeling layer forming step (S1). If the cracks 15*b* and 15*d* propagate to regions near the side surface 11*c* of the ingot 11 in the separation step (S2), for example, it may not be necessary to form the peeling layers 15 in some or all of the regions near the side surface 11*c* of the ingot 11 in the peeling layer forming step (S1).

In the present invention, the focal points, at which the split laser beams LB are focused, and the ingot 11 may be relatively moved in a state where the focal points are positioned at the second depth to be shallower than the first depth in the second laser beam irradiation step (S121).

The separation step (S2) of the present invention may also be performed using a device other than the separation apparatus 18 depicted in FIGS. 14A and 14B. In the separation step (S2), the substrate 17 may be separated from the ingot 11, for example, by sucking the ingot 11 on the side of the front surface 11*a*.

Figure 16A:
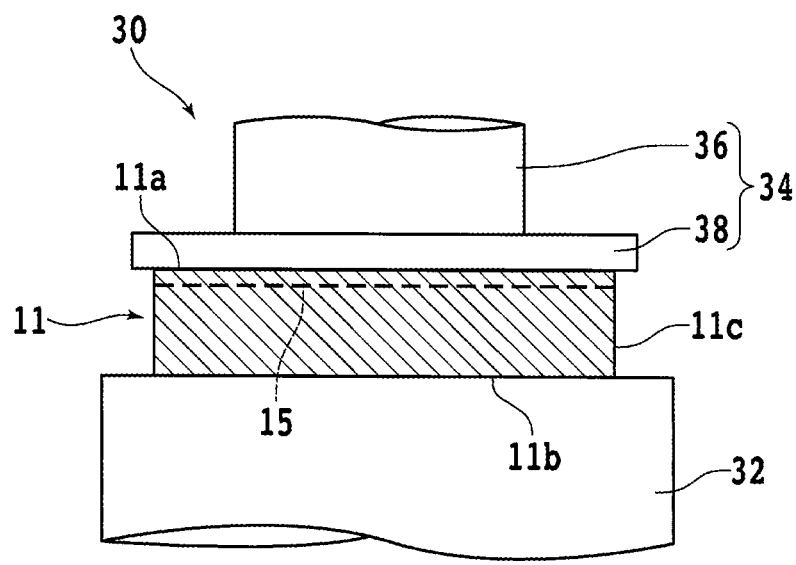
FIG. 16A is a partly cross-sectional side view schematically depicting how a second example of the separation step depicted in FIG. 3 is performed at a first stage.
Figure 16B:
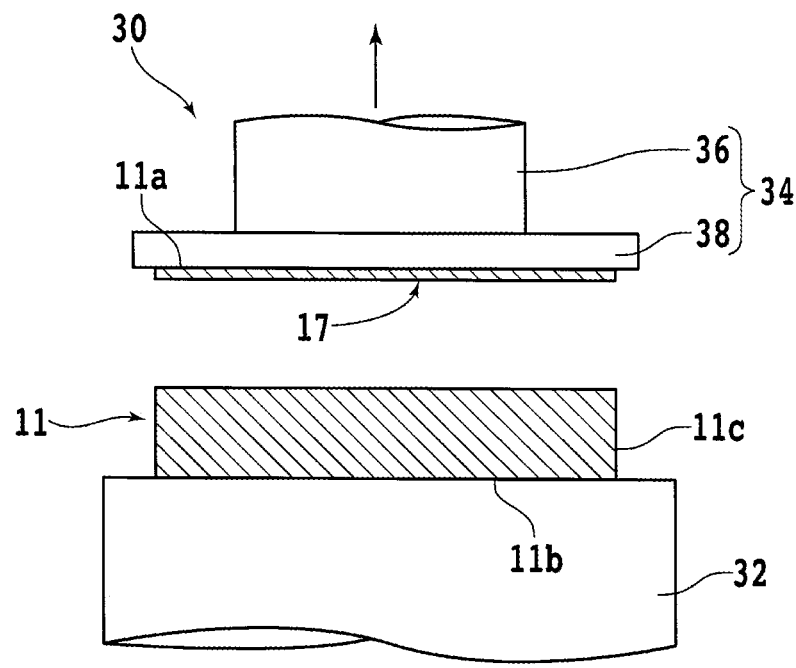
FIG. 16B is a partly cross-sectional side view schematically depicting how the second example of the separation step depicted in FIG. 3 is performed at a second stage.

FIGS. 16A and 16B are partly cross-sectional side views schematically depicting how the separation step (S2) is performed as described above. A separation apparatus 30 depicted in FIGS. 16A and 16B has a holding table 32 that holds the ingot 11 with the peeling layers 15 formed therein.

The holding table 32 has a circular upper surface (holding surface), and a porous plate (not depicted) is exposed on the holding surface. This porous plate is in communication with a suction source (not depicted) such as a vacuum pump via a flow channel or the like disposed inside the holding table 32.

When this suction source is operated, a suction force therefore acts on a space near the holding surface of the holding table 32. As a consequence, the ingot 11 placed, for example, on the holding surface can be held by the holding table 32.

Above the holding table 32, a separation unit 34 is also disposed. The separation unit 34 has a cylindrical support member 36. To an upper portion of the support member 36, a lift mechanism (not depicted) of, for example, the ball screw type is connected. By operating this lift mechanism, the separation unit 34 is moved up or down.

A lower end portion of the support member 36, on the other hand, is centrally fixed on an upper portion of a disk-shaped suction plate 38. Through a lower surface of the suction plate 38, a plurality of suction openings is formed, and these suction openings are each in communication with a suction source (not depicted) such as a vacuum pump via a flow channel or the like disposed inside the suction plate 38.

When this suction source is operated, a suction force therefore acts on a space near the lower surface of the suction plate 38. The ingot 11 placed, for example, in close proximity to the lower surface of the suction plate 38 can be sucked such that it is pulled upward.

On the separation apparatus 30, the separation step (S2) is performed, for example, in the following order. Described specifically, the ingot 11 with the peeling layers 15 formed therein is first placed on the holding table 32 so that the center of the back surface 11b of the ingot 11 and the center of the holding surface of the holding table 32 are brought into registration with each other.

The suction source, which is in communication with the porous plate exposed on the holding surface, is then operated so that the ingot 11 is held on the holding table 32. The lift mechanism is next operated to move the separation unit 34 downward so that the lower surface of the suction plate 38 is brought into contact with the front surface 11a of the ingot 11.

The suction source, which is in communication with the suction openings formed in the suction plate 38, is then operated so that the ingot 11 is sucked on the side of the front surface 11a thereof via the suction openings (see FIG. 16A). The lift mechanism is next operated to move the separation unit 34 upward so that the suction plate 38 is moved apart from the holding table 32 (see FIG. 16B).

At this time, an upward force acts on the side of the front surface 11a of the ingot 11 sucked on the side of the front surface 11a thereof via the suction openings formed in the suction plate 38. As a result, the cracks 15b and 15d contained in the peeling layers 15 are allowed to further propagate, whereby the ingot 11 is separated between the side of the front surface 11a and the side of the back surface 11b. Using the peeling layers 15 as starting points, the substrate 17 is therefore manufactured from the ingot 11.

In the separation step (S2) of the present invention, ultrasonic waves may be applied to the side of the front surface 11a of the ingot 11 before the separation of the ingot 11 between the side of the front surface 11a and the side of the back surface 11b. If this is the case, the cracks 15b and 15d contained in the peeling layers 15 are allowed to further propagate, thereby facilitating the separation of the ingot 11 between the side of the front surface 11a and the side of the back surface 11b.

In the manufacturing method of this embodiment, the front surface 11a of the ingot 11 may be planarized by grinding or polishing before the peeling layer forming step (S1) (planarization step). This planarization may also be performed, for example, when manufacturing a plurality of substrates from the ingot 11.

Described specifically, after the substrate 17 has been manufactured by the separation of the ingot 11 at the peeling layers 15, irregularities are formed, reflecting the distribution of the modified portions 15a and 15c and cracks 15b and 15d contained in the peeling layers 15, on a newly exposed surface of the ingot 11. When manufacturing a new substrate from the ingot 11, it is hence preferred to planarize the surface of the ingot 11 before the peeling layer forming step (S1).

As a consequence, the split laser beams LB applied to the ingot 11 in the peeling layer forming step (S1) can be suppressed from diffused reflection on the front surface of the ingot 11. In the present invention, the substrate 17 separated from the ingot 11 may also be planarized by grinding or polishing at its surface on the side of the peeling layers 15.

In the present invention, a substrate may also be manufactured using, as a workpiece, a bare wafer formed of single crystal silicon and produced so that a specific crystal plane included in the {100} crystal planes is exposed on a front surface and a back surface, respectively.

This bare wafer has a thickness of, for example, twice to 5 times as large as the substrate to be manufactured. This bare wafer is in turn manufactured, for example, through separation from an ingot 11 by a similar method as the above-mentioned method. In this case, the substrate can be rephrased as being manufactured by repeating the above-mentioned method twice.

In the manufacturing method of this embodiment, a substrate may also be manufactured using, as a workpiece, a device wafer manufactured by forming semiconductor devices on one side of such a bare wafer. In this case, split laser beams LB may preferably be applied to the device wafer from the other side thereof, where the semiconductor devices are not formed, so that adverse effects on the semiconductor devices are prevented.

Moreover, the construction, method and the like which relate to the above-mentioned embodiment can also be practiced with appropriate modifications within the scope of the object of the present invention.

The present invention is not limited to the details of the above-described preferred embodiment and modifications. The scope of the invention is defined by the appended claims and all changes and modifications as fall within the equivalence of the scope of the claims are therefore to be embraced by the invention.

What is claimed is:

1. A manufacturing method of a single crystal silicon substrate that manufactures the substrate from a workpiece formed of single crystal silicon and produced so that a specific crystal plane included in {100} crystal planes is exposed on a front surface and a back surface, respectively, the method comprising:

a peeling layer forming step of forming, inside the workpiece, peeling layers that include modified portions and cracks propagating from the modified portions; and a separation step of, after performing the peeling layer forming step, separating the substrate from the workpiece using the peeling layers as starting points, wherein the peeling layer forming step includes a first processing step of forming some of the modified portions in a plurality of first regions that each extend along a first direction, the first direction being parallel to the specific crystal plane and forming an angle of 5° or less with respect to a specific crystal orientation included in <100> crystal orientations, and that are separated from one another in a second direction, the second direction being parallel to the specific crystal plane and being orthogonal to the first direction, and a second processing step of, after performing the first processing step, forming the remaining part of the modified portions and the cracks in a plurality of second regions that each extend along the first direction and that are separated from one another in the second direction, any one of the second regions is located between adjacent paired first regions, any one of the first regions is located between adjacent paired second regions, the first processing step is performed by alternately repeating a first laser beam irradiation step of relatively moving focal points, at which a plurality of split laser beams of a wavelength having transmissivity for the single crystal silicon are focused, and the workpiece along the first direction with the focal points positioned inside one of the first regions and at a first depth from the front surface of the workpiece, and a first indexing feed step of relatively moving positions, where the focal points are formed, and the workpiece along the second direction, the second processing step is performed by alternately repeating a second laser beam irradiation step of relatively moving the focal points and the workpiece along the first direction with the focal points positioned inside one of the second regions and at a second depth, the second depth being different from the first depth, from the front surface of the workpiece, and a second indexing feed step of relatively moving the positions, where the focal points are formed, and the workpiece along the second direction, and the split laser beams to be focused at the focal points in the second laser beam irradiation step have a higher power than the split laser beams to be focused at the focal points in the first laser beam irradiation step.

2. The manufacturing method of the single crystal silicon substrate according to claim 1, wherein the second depth is greater than the first depth.

3. The manufacturing method of the single crystal silicon substrate according to claim 2, wherein a first plane that passes through a first straight line along the first direction, the first straight line passing through a center of the second region positioned between the adjacent paired first regions, and a second straight line along the first direction, the second straight line passing through a center of one of the adjacent paired first regions, forms an angle of 45° or less with respect to the front surface and the back surface of the workpiece, and a second plane that passes through the first straight line and a third straight line along the first direction, the third straight line passing through a center of the other one of the adjacent paired first regions, forms an angle of 45° or less with respect to the front surface and the back surface of the workpiece.

4. The manufacturing method of the single crystal silicon substrate according to claim 1, wherein a first plane that passes through a first straight line along the first direction, the first straight line passing through a center of the second region positioned between the adjacent paired first regions, and a second straight line along the first direction, the second straight line passing through a center of one of the adjacent paired first regions, forms an angle of 45° or less with respect to the front surface and the back surface of the workpiece, and a second plane that passes through the first straight line and a third straight line along the first direction, the third straight line passing through a center of the other one of the adjacent paired first regions, forms an angle of 45° or less with respect to the front surface and the back surface of the workpiece.

\* \* \* \* \*